PRINTED TRANSISTORS AND METHODS OF MAKING SAME

Filed Dec. 21, 1964 2 Sheets-Sheet 1

INVENTORS:
YRO T. SIHVONEN
SIDNEY G. PARKER
William D. Hanus Jr.
ATTORNEY

PRINTED TRANSISTORS AND METHODS OF MAKING SAME

Filed Dec. 21, 1964 2 Sheets-Sheet 2

INVENTORS:
YRO T. SIHVONEN
SIDNEY G. PARKER

William D. Harris, Jr.
ATTORNEY

United States Patent Office 3,369,159

Patented Feb. 13, 1968

3,369,159

PRINTED TRANSISTORS AND METHODS OF MAKING SAME

Yro T. Sihvonen, Richardson, and Sidney G. Parker, Dallas, Tex., assignors to Texas Instruments Incorporated, Dallas, Tex., a corporation of Delaware Filed Dec. 21, 1964, Ser. No. 419,923
4 Claims. (Cl. 317—235)

This invention relates to printed transistors and to methods of making same. More particularly, it relates to printed transistors of the field effect type.

Field effect transistors are known in the art. In general, they consist of a semiconductor member having a source and a drain contact, a gate electrode, and (sometimes) a dielectric medium. By control of the circuit involving the gate electrode, i.e., the gate circuit, the flow between the source and the drain contacts, via the semiconductor, is controlled.

Construction of a field effect transistor by the techniques of the prior art involves a multiplicity of rather cumbersome and/or complex steps. As far as is known, construction of a field effect transistor, for that matter any transistor, has never been accomplished by printing techniques. If such a transistor could be produced by printing techniques it may readily be seen that the possibility of vastly simplifying its fabrication would be presented.

It is an object of the present invention to provide a field effect transistor which may be fabricated by printing techniques. Moreover, it is an object of the present invention to provide such a printed field effect transistor of quality and efficiency, yet which may be produced by printing techniques on a mass production basis. It is yet an additional object of the present invention to provide a printed field effect transistor which may be fabricated in combination with a fully printed circuit, including other components and conductive paths.

U.S. patent application Ser. No. 419,895, filed concurrently herewith, entitled Printed Circuits, Printed Circuit Components, and Methods of Making Same, invented by Yro T. Sihvonen and Ira M. Le Baron contains subject matter related to the present invention. That application relates to a printed semiconductor device broadly, a diode specifically, and to fully printed circuits containing such device, or diode. By way of contrast, the present invention is specific to printed transistors, and to printed transistors in combination with a printed circuit. The present invention bears the relation of improvement to the invention of the said application Ser. No. 419,895. The present specification (contrasted to the claims) and drawings include a description of the subject matter of the invention of the said copending application in order to give a better understanding of the significance of the present invention and its application in circuitry. The subject matter of the said copending application does not, however, constitute any part of the present invention; accordingly it is claimed only in said U.S. application Ser. No. 419,895.

The present invention provides a field effect transistor which comprises a sintered polycrystalline semiconductor layer, a source contact and drain contact spaced apart and engaging the semiconductor layer, a gate electrode, and a dielectric disposed between the semiconductor layer and the gate electrode. Preferably the sintered polycrystalline semiconductor layer and all other elements of the transistor are printed to overlie a substrate.

In a preferred embodiment, the dielectric of the field effect transistor is of a material having a dielectric constant no less than on the order of about $10^3$ at the operating frequency of the transistor. Nitrocellulose and sodium silicate compounds are specifically preferred as materials of construction for such dielectric.

Preferred materials of construction for the semiconductor layer involved in the field effect transistor of the present invention are Group IIB–VIB semiconductor compounds, with the sulfides, selenides, and tellurides of cadmium and zinc being specifically preferred.

The process aspect of the present invention includes formation of a field effect transistor by printing techniques. An essential step is the application of a semiconductor ink, comprised of a liquid carrying a multiplicity of discrete particles of a semiconductor material, to overlie a substrate. The ink is dried to leave a layer of semiconductor material deposited on the substrate. The semiconductor layer is sintered. Preferably the semiconductor particles are of a Group IIB–VIB compound, with the sulfides, selenides, and tellurides of cadmium and zinc being preferred. The semiconductor layer is sintered at an effective sintering temperature, which, for the preferred semiconductor materials has the critical value of between about 500° C. and 1000° C.

Preferably, all of the elements of the field effect transistor are formed by printing techniques. In accordance with these preferred techniques, the invention provides a process for preparing a fully printed field effect transistor which comprises the steps of printing each of the following to overlie a substrate: a semiconductor layer, spaced apart source and drain contacts in intimate engagement with the semiconductor layer, a gate electrode spaced apart from the semiconductor layer and from the source and drain contacts, and a dielectric layer disposed intermediate the semiconductor layer and the gate electrode.

A specific embodiment of the present invention provides for a fully printed circuit which includes a transistor formed entirely by printing procedures. The process aspect of this embodiment includes forming a transistor by printing a semiconductor layer, printing spaced apart source and drain contacts in intimate engagement with the semiconductor layer, printing a gate electrode spaced apart from the semiconductor layer and from the source and drain contacts, and printing a dielectric layer disposed intermediate the semiconductor layer and the gate electrode. At least one passive component is printed. At least one circuit path electrically connecting the passive component and transistor is also printed.

For a more complete understanding of the present invention and for further objects and advantages thereof, reference may now be had to the following description taken in conjunction with the accompanying drawings in which:

FIGURE 1 is a schematic, sectional elevational view illustrating a printed diode, which is no part of the present invention, being described and claimed in said copending U.S. patent application Ser. No. 419,895. This figure, as well as the associated description contained herein, is presented in this specification to facilitate the description of certain techniques and inks which assist in a more complete understanding of the present invention. FIGURES 4, 5, 6, 7, and 8 are, like FIGURE 1, not illustrative of the present invention, but are presented to facilitate the explanation of ancillary matters and more fully describe the field of use of the present invention;

Figure 1:
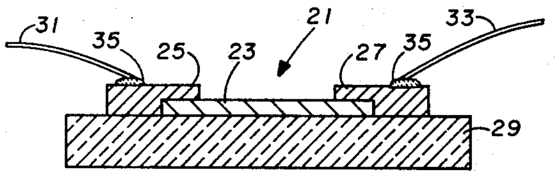
Figure 4:
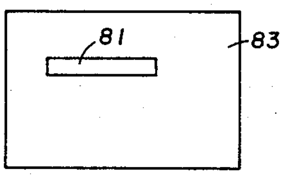
Figure 5:
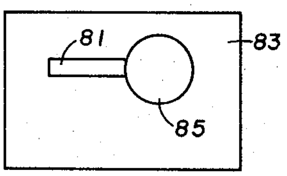
Figure 6:
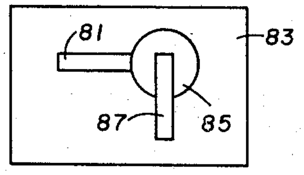
Figure 7:
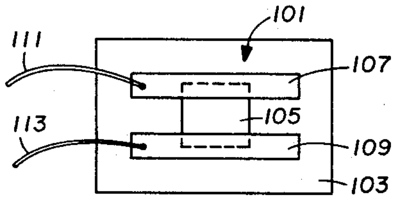
Figure 9:
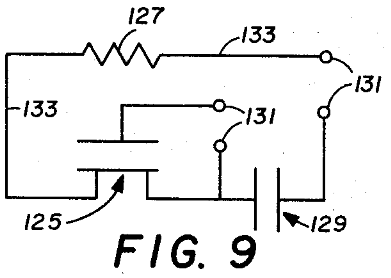
Figure 8:
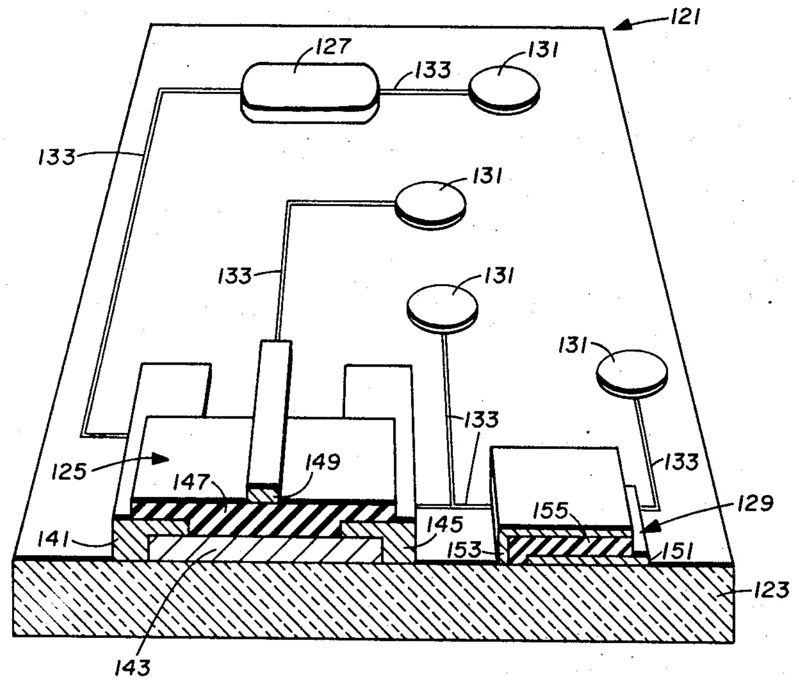

FIGURES 4, 5, and 6 are schematic, plan views illustrating the formation of a diode by printing to overlie a substrate, and illustrate no part of the present invention, as previously explained herein in connection with the comment relating to FIGURE 1;

FIGURE 7 is a schematic, plan view illustrating a photoresistor, formed entirely by printing techniques and is presented merely to give background;

FIGURE 8 is a schematic, pictorial view, in section, showing a fully printed circuit, including a field effect transistor, in accordance with the present invention; and FIGURE 9 is a circuit diagram illustrating the circuit of the structure of FIGURE 8.

Turning now to FIGURE 1, therein is illustrated a semiconductor diode device 21 which includes the thin semiconductor layer 23, the metal contact 25, which forms a rectifying junction at its boundary with semiconductor layer 23, and the ohmic contact 27 which adjoins the semiconductor layer 23 at a location spaced apart from the contact 25. Semiconductor layer 23, contact 25, and contact 27 all overlie the insulating substrate 29. Conductors 31 and 33 are conductively joined to contacts 25 and 27, respectively, as by a conductive glue or adhesive 35.

The semiconductor layer 23 consists of a multiplicity of discrete particles of semiconductor material. The semiconductor layer 23 is bonded to the insulating substrate 29, which may be for example, of alumina, quartz, barium titanate, and various other insulating materials. The various particles of the polycrystalline mass which make up the semiconductor layer 23 are in close abutting relation, in order that semiconduction phenomena may occur in the layer.

The contact 25 forms a rectifying junction with the semiconductor layer 23. It is comprised of a metal having substantial diodic action when in junction with the semiconductor material; thus, the work function of the metal should be dissimilar from the work function of the semiconductor material. For example, when cadmium sulfide or cadmium selenide is the material of construction for the semiconductor layer 23, such metals as silver, gold, and tellurium are preferred for the contact 25. Also, various other metals may be used, for example, antimony, phosphorus, bismuth, and alloys and mixtures of silver, gold, and tellurium with antimony, bismuth, and phosphorus.

The contact 27 should allow the free passage of carriers, i.e. it should be ohmic in nature. Satisfactory ohmic contact may be provided by various materials, for example, by indium, tin, or to a lesser extent, graphite.

The semiconductor layer and contacts of the diode device 21 may all be formed by printing techniques. In general, as used herein, the term "printing" refers to the emplacement of an ink on an object in a desired location. The term "ink" refers to a material comprising a liquid which can be dried or cured to produce a layer having certain desired properties or to an evaporable or decomposable liquid carrying a multiplicity of discrete solid particles of desired characteristics. Thus, the placing of an evaporable liquid, carrying particles of a solid, on a substrate by means of silk screening, painting on with a brush, controlled spraying, etc., is within the general scope of the term "printing." Likewise, placing a liquid material which is curable to become solidified or hardened on a substrate by such means is also included within the meaning of the term. The specific meaning intended for "ink" and for "printing" can be determined from the context of each use made herein, including the claims, by consideration of such use, in context, with the foregoing general definitions in mind.

As a specific example of the making of structure in accordance with FIGURE 1, an ink consisting of a suspension of fine particles of cadium sulfide in a carrier liquid, together with a small amount of a binder, e.g. ethyl cellulose, is painted, sprayed, or silk screened upon the substrate 29. The deposited ink is then subjected to a preliminary drying step. Preliminary drying may be accomplished in air by permitting exposure at room temperature for several hours, or alternatively, by exposure under a heat lamp for a short period, for example, for about one-half hour. After completion of the preliminary drying step, the substrate carrying the partially dried ink is inserted in an oven and baked for several hours at an elevated temperature, for example, for about one hour at about 200° C. The last traces of liquid are thus evaporated and the particles which were carried into position by the ink are bonded together to define a semiconductor mass. It appears that the bonding so accomplished under these conditions (200° C. for about one hour) involves very little sintering action, the bond primarily being accomplished by dried binder supporting the particles in close contact.

After removal from the oven and cooling, the silver contact 25 is applied by painting, silk screening, or other printing technique to overlie and intimately contact the semiconductor layer 23. Standard silver paint preparations wherein small particles of silver are carried by an organic solvent, are satisfactory for this purpose. Many such preparations are well-known in the art. One that works quite well is sold by the Du Pont Corporation, its label bearing the designation "Silver Preparation No. 5584." The silver preparation is allowed to dry, e.g. under a heat lamp for about one-half hour. A rectifying junction is formed between the silver contact 25 and the semiconductor layer 23 as a result of the foregoing.

The ohmic contact 27 is applied by printing, e.g. painting, spraying, silk screening, etc., a conductive, adhesive graphite-carrying ink over the semiconductor layer 23 at a point spaced apart from the contact 25. While many different conductive adhesive graphite inks may be utilized, one commercially available is sold under the trademark "DAG–154" by Acheson Colloids Co. The graphite ink is permitted to dry at room temperature for about one-half hour, or drying may be hastened by heating, as by a heat lamp, leaving the contact 27 defined as a mass of carbon in close abutment with the semiconductor layer 23. In place of graphite ink, an indium ink, tin ink, or other conductive ink (preferably ohmic in nature) may be used for the contact 27.

Conductors 31 and 33 are applied to the contacts 25 and 27, respectively, by suitable conductive means, for example, by a conductive silver preparation having adhesive properties. The preparation sold by the Du Pont Corporation under the designation "Silver Preparation No. 55847" may be used for this purpose.

The resulting product of the foregoing procedure is the diode device 21, illustrated in FIGURE 1.

Better results in many instances are obtained by applying filler, e.g. a plastic, to the semiconductor layer 23 prior to the application of the contact 25. The plastic fills voids in the semiconductor layer 23 and makes only the outer granules of semiconductor material available for contact with the silver. The resulting junction between the silver and semiconductor consequently has a minimized number of parallel sub-junctions defined. The plastic so applied may be, for example, an acrylic ester resin. The commercially available product "Krylon." from Krylon, Inc. (a product of about 6% acrylic ester carried by about 94% hydrocarbon solvents) is satisfactory.

An optional, but preferred technique for making a diode device, such as the diode 21 of FIGURE 1, involves distinctly sintering the semiconductor layer. As previously mentioned, little sintering is accomplished on the layer 23 by heating for one hour at 200° C. If the temperature is raised to a substantially higher value, e.g. to a value from about 500° C. to about 1000° C. in the case of the sulfides, selenides and tellurides of cadmium and zinc, a distinctly sintered layer 23 results in a few minutes. The resulting sintered layer provides the basis for a structurally sound diode device that is electrically superior as a diode for many applications.

Preferred semiconductor materials for making the semiconductor layer 23 include Group IIB–VIB compounds, with the sulfides, selenides, and tellurides of cadmium and zinc being particularly preferred.

Figure 2:
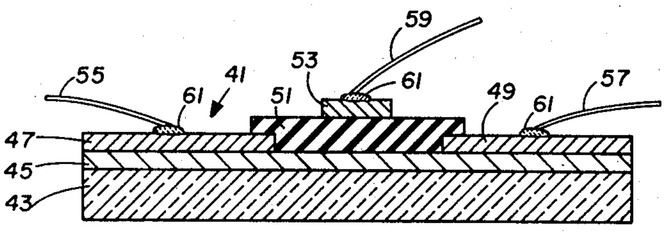
FIGURE 2 is a schematic, sectional elevational view of a field effect transistor in accordance with the present invention.

A specific ink formulation comprising particles of cadmium sulfide-cadmium selenide, is discussed at an ensuing point herein in connection with the layer 45 of the structure illustrated in FIGURE 2. This ink works quite well as semiconductor ink for forming layer 23 of the diode 21.

FIGURE 2 illustrates another type of semiconductor device which can be made by full utilization of printing techniques. This device is the field effect transistor, indicated generally by the numeral 41. The field effect transistor 41 is carried upon the insulating substrate 43, which may be made, for example of alumina, quartz, barium titanate or various other insulating materials. A layer of printed, sintered semiconductor material 45 extends across and is bonded to the upper surface of the insulating substrate 43 which may be, for example, of a thin cylindrical disk shape. The semiconductor layer 45 is polycrystalline in nature, consisting of a multiplicity of discrete, individual particles of a semiconductor which adjoin each other to insure that semiconductive action is obtained from the layer. The close packing of the discrete particles, and their bonding together, as well as the firm bonding of the layer 45 to the underlying substrate surface, is preferably accomplished, as will be explained in more detail hereinafter, by sintering at relatively high temperatures.

Spaced apart source and drain contacts 47 and 49 are disposed over and bonded to opposite upper surface regions of semiconductor layer 45. These contacts are of a good conducting material, and are essentially ohmic in nature. Various materials may be used for contacts 47 and 49, indium and gallium being examples of a material that is quite satisfactory. The dielectric 51 overlies the upper face of semiconductor layer 45. In the embodiment of FIGURE 2, the dielectric also abuts oppositely disposed sides of the contacts 47 and 49 and also overlies respective portions of these contacts. The dielectric 51 may be of various materials, for example, it may be nitrocellulose or a sodium oxide-silicon dioxide mixture. In general, for the device 41 to function well as a transistor, it is necessary either that the insulating material 51 have a rather high dielectric constant, preferably no less than on the order of about $10^3$, at the operating frequency of the device, or that the dielectric be vary thin, or that the contacts 47 and 49 be in very close proximity, or that the semiconductor material inherently have a high carrier mobility.

A third contact, the gate electrode 53, is bonded to and extends upwardly from a central surface region of the dielectric 51. Gate electrode 53 may be of various conductive materials, an example being silver.

Conductive leads 55, 57, and 59 are conductively joined to the source contact 47, drain contact 49, and gate electrode 53, respectively as by conductive cement or glue 61.

Figure 3:
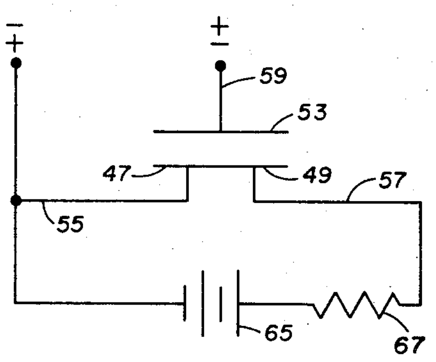
FIGURE 3 is a circuit diagram of the field effect transistor of FIGURE 2.

An illustrative circuit employing field effect transistor 41 is shown in FIGURE 3. Therein the field effect transistor 41 has a D.C. control signal voltage impressed across the lead 59 to gate electrode 53 and across the lead 55 to the source electrode 47. The circuit controlled by the field effect transistor 41 is indicated as including the D.C. power source 65 and the load 67. The negative side of this circuit is illustrated as being connected to the source 47 through the conductive lead 55 and the positive side of the circuit to the drain 49 through the conductive lead 57. In the circuit of FIGURE 3, with the signal voltage applied so that gate 53 is positive with respect to the source 47, a secondary or increased current flows from the source electrode 47 to the drain electrode 49 as a result of the increased number of carriers available along the path between the source and the drain. In effect, the total current flowing between the source and the drain is the total of the secondary current induced as a result of the increased carriers plus the primary current flowing. If the control signal voltage is changed in polarity, the total current flowing from the source to the drain is much less, being the primary current minus the secondary current. Accordingly, it will be appreciated that the current through the control circuit can be varied, through variation of the signal voltage applied to the gate circuit.

A satisfactory ink for the semiconductive layer 45 of field effect transistor 41 (as well as for the semiconductive layer 23 of diode 21) may be based upon a 50%–50%, by weight, mixture of small particles of cadmium sulfide and cadmium selenide carried by an appropriate liquid vehicle. A specific example of preparation of such an ink is as follows: Equal weight quantities of cadmium sulfide and cadmium selenide are mixed and placed under vacuum conditions at 120° C. for 16 hours for "out-gassing," the principal effect of which is to remove water and air. Thereafter, the particle mix is sintered in a hydrogen sulfide atmosphere at approximately atmospheric pressure for about 4 hours. The sintering temperature is on the order of about 950° C. The resulting sintered mixture of cadmium sulfide and cadmium selenide is ground, as by mortar and pestle, to approximately 50 mesh size. Particle sizing control may be effected by screening, in accordance with well-known techniques. To 10 grams of the 50 mesh cadmium sulfide-cadmium selenide so obtained, approximately 10 cc. of a 5%, by weight, solution of cadmium chloride in water is added. A slurry is made of the solution and the particles of cadmium sulfide-cadmium selenide. While continuously being stirred, the slurry is evaporated to dryness. Approximately 10 grams of powder consisting essentially of an intimate mixture of cadmium sulfide and cadmium selenide particles is obtained as the residue. This powder (approximately 10 grams), together with about 45 cc. of one percent, by weight, solution of ethyl cellulose in butyl Cellosolve (ethylene glycol monobutyl ether), is placed into a ceramic ball mill. Ball milling is conducted until the cadmium sulfide-cadmium selenide powder particle size reaches about one micron. This usually takes about 16 hours. The resulting product is a satisfactory ink for making the semiconductor layer for the field effect transistor of the present invention. This particular ink is stable for at least limited storage—no appreciable settling is observed in two days.

A process for manufacture of the field effect transistor of FIGURE 2, including the use of an ink such as that described above containing small particles of cadmium sulfide and cadmium selenide, will now be discussed. A thin layer of the cadmium sulfide-cadmium selenide ink is applied by printing, for example, by silk screening. Since the particles in the ink are about one micron in size, a sufficient quantity of the ink should be applied to insure that the ultimate semiconductor particle layer obtained is at least one particle in thickness, i.e. on the order of about one micron. In practice, the semiconductor layer thickness will vary, about five microns being a typical example. A preliminary drying step is preferably conducted to remove most of the liquid from the ink. This may be accomplished, for example, by drying under a heat lamp for about one-half hour, or by drying in air for a somewhat longer period. After this preliminary drying step, the alumina disk 43 carrying the preliminarily-dried semiconductor ink is placed face down on a clean alumina block for about one hour in an oven at a temperature of 570° C. Although other temperatures may be used, with this specific particle mix it is preferred that the temperature neither be much below 500° C., since sintering becomes inferior therebelow, nor much above 1000° C., since a loss of material through volatilization becomes serious thereabove. After sintering, the semiconductor layer 45 is complete.

The source contact 47 and the drain contact 49 are applied to spaced apart portions of the semiconductor layer 45. This is preferably accomplished by printing the contacts on the semiconductor layer 45 by means of a suitable ink. For example, an ink consisting of 10 grams of indium suspended in a solution of 3 cc. of glycol, 1 cc. of water, 0.5 cc. of pine oil, and 0.1 cc. of a nonionic surfactant (such as Dowfax nonionic surfactant) may be used. A better ink for many applications consists of an indium-mercury amalgam, about 5% indium and the balance mercury. Drying of this amalgam ink is best accomplished under vacuum, e.g. $10^{-3}$ mm. mercury at 120° C. for about 6 hours. This procedure removes most of the mercury and leaves the indium deposited in the desired printed position. Alternatively, a gallium-tin alloy ink may be used without drying.

While printing source and drain contacts 47 and 49, in some instances it will be found desirable to mask center portions of the semiconductor layer 45 to insure that the source and drain contacts are printed on in spaced apart locations so that no short circuit paths between them result.

After the source and drain contacts have dried, a dielectric ink is next applied by printing technique to form the central dielectric 51. The ink used for this purpose may consist of nitrocellulose dissolved in ether, alcohol, or ethylene glycol monomethyl ether (methyl Cellosolve), plus a compatible plasticizer. Examples of materials available on the market that may be used for this purpose are Collodion (a solid nitrocellulose preparation made by J. T. Baker Chemical Co. and others) or Duco Cement (a preparation made by Du Pont). Another satisfactory commercially available material is Saeureisen Cement P–1, which is a preparation of sodium oxide and silicon dioxide available from the Saeureisen Cement Company. If the Saeureisen Cement P–1 is used, it is mixed 50%, by weight, with water. The resulting compound formed by this mixture, on drying, can be seen to be a sodium silicate compound, probably a sodium silicate hydrate. Another material which may be used consists of a monomer, e.g. vinyl acetate, applied as an ink and then polymerized, as by heating.

After application, the applied dielectric ink is permitted to dry for about one hour at room temperature.

The gate electrode 53 is prepared by printing a suitable ink on the upper surface of the dielectric 51. The ink selected for this purpose is conductive and preferably non-reactive with the dielectric. A satisfactory ink may be prepared by mixing the following materials in the designated proportions: 16 grams of zein (a complex organic material extracted from corn), 33 grams of 2-methyl 2,4-pentanediol, 33 grams of water, and 20 grams of silver particles (325 mesh). Alternatively, a commerical silver preparation may be used, for example, the preparation sold by the Du Pont Corporation under the designation "Silver Preparation No. 5584."

The ink applied to form the gate electrode 53 is permitted to dry at room temperature for about one hour. On completion of drying of this ink, the field effect transistor device 41 of FIGURE 2 is completed, except for attachment of such leads as may be desired. For example, leads 55, 57, and 59 may be attached conductively to the source electrode 47, drain electrode 49, and gate electrode 53, respectively, by conductive silver glue to provide connection 61. Many such conductive silver glues are known in the art. One which may be obtained commercially is sold by the Du Pont Corporation under the designation "Preparation 5584."

After attachment of the conductive leads, it may be desired to encapsulate or cover the semiconductor device 41 by applying epoxy resin or silicone and/or it may be sealed in a suitable container.

FIGURES 4, 5 and 6 sequentially illustrate the prepartion of a diode by printing. In FIGURE 4, a contact strip 81 has been printed upon the thin insulating substrate 83, as by silk screening. The ink may be, for example, a conductive graphite or indium ink. After drying, a semiconductor layer 85 is formed by application of a semiconductor ink to overlie and contact an end portion of the contact strip 81. For example, an ink comprising a volatile material carrying a suspension of cadmium sulfide particles (or alternatively, the cadmium sulfide-cadmium selenide mix previously described herein) is applied to overlie an end portion of the contact strip 81 formed by the initial printing step. The drying of the ink forming layer 85 is preferably accomplished by a preliminary drying step, followed by sintering at relatively high temperatures, for example, at about 600° C. Thereafter a silver contact strip 87 is printed with its end portion overlying and in contact with the upper surface of the printed semiconductor layer 85 (FIGURE 6). The silver contact strip 87 is dried and the diode device is completed.

Alternatively, the process of manufacture described in connection with FIGURES 4, 5, and 6 may be accomplished by printing without an intermediate high temperature drying or sintering step. With such an approach, only a short period is allowed for a preliminary drying step which is conducted at low temperatures, as by a infra red lamp, and the final drying and sintering (if sintering is desired) is conducted after all printing is completed, i.e. after application of all of the inks.

A photoresistor may be produced entirely by printing procedures. Referring to FIGURE 7, therein the photoresistor 101 is a printed device, carried by the non-conductive substrate 103, which, for example, may be alumina, quartz, barium titanate, or any one of a variety of other non-conductive materials. The photoresistor includes the photosensitive layer 105 and the spaced apart contacts 107 and 109, which overlie and conductively join to the upper surface regions of the photosensitive layer 105. The photosensitive layer 105 may be applied by silk screening the ink into place in accordance with the desired pattern. The ink may be, for example, a cadmium sulfide material containing chlorides and copper. This material, with the copper present, might be characterized as a "semi-insulator" as well as a photosensitive material. It is distinguishable from cadmium sulfide semiconductor material since the impurities purposely present (copper, for example) make the material semi-insulating as opposed to semiconducting in nature.

The photoresistor ink is allowed to dry for a relatively short period, either at ambient temperature or at a somewhat elevated temperature provided, for example, by a heat lamp. Thereafter, the spaced apart elongated contacts 107 and 109 are printed to partially overlie and contact the photosensitive layer 105. Contacts 107 and 109 are preferably ohmic in nature. Satisfactory contacts may be made with a variety of inks, for example, with indium or carbon inks. After application of the inks to form contacts 107 and 109, drying is permitted. External leads 111 and 113 may be connected to the contacts 107 and 109, respectively, if desired, by various means, such as by application of conductive adhesive preparations, many of which are readily available and well-known in the art.

The present invention may be used to form a fully printed circuit. By way of an example, an illustrative printed circuit, highly schematic in nature, is shown in FIGURE 8. Therein, the circuit assembly 121 is carried by the alumina substrate 123. The circuit includes the field effect transistor 125, the resistor 127, and the capacitor 129. Printed circular contact regions 131 provide for connection to the circuit assembly. Interconnection of the components and contacts is made by printed conductive paths 133. The effective circuit provided by the circuit assembly 121 is illustrated in the circuit diagram of FIGURE 9.

The field effect transistor 125 is quite similar to the field effect transistor 41, illustrated in FIGURE 2 and discussed in connection therewith. It consists of the source 141, semiconductor region 143, drain 145, dielectric 147, and gate electrode 149. The same steps of manufacture may be used in forming field effect transistor 125 as were described for the formation of field effect transistor 41 of FIGURE 2.

The resistor 127 is printed by application (as by silk screening) of a resistive ink. Such an ink consists of a volatile liquid carrying granules of a resistive material, for example, particles of graphite, together with a non-conductive filler, e.g. aluminum or kaolin. Alternatively, a silver-palladium oxide preparation, thinned with butyl carbitol acetate, may be used. A satisfactory commercially available silver-palladium oxide preparation may be obtained from the Du Pont Corporation under the designation "No. 7828."

The conductive paths 133 for the circuit assembly 121 are printed in accordance with the desired, predetermined pattern (as by silk screening) with a conductive ink. Such an ink consists of a volatile liquid carrying suitable conductor granules, for example, silver or a platinum-gold preparation. Toluene, xylene, and like hydrocarbons may be used as the volatile liquid carrier. A commercially available platinum-gold preparation which is quite useful can be obtained from the Du Pont Corporation under the designation "No. 7553." Such preparations are well-known in the art and may be obtained from a variety of sources or may be made up as desired.

The enlarged contact regions 131 are preferably printed at the same time as the conductive paths 133, using the same type ink.

The capacitor 129 consists of the spaced apart plates 151 and 153, separated by the dielectric 155. The capacitor 129 may be made by printing the plate 151 onto the upper surface of the substrate 123, followed by printing of the dielectric 155, and finally, the plate 153. The dielectric may be printed with a variety of inks, for example, those materials used for the dielectric 147 of the field effect transistor 125 (the same as the dielectric 51 of the field effect transistor 41 of FIGURE 2). The printed plates 151 and 153 are formed by printing with conductive inks, for example, the same ink used for formation of the contact regions 131 and the conductive paths 133.

As used herein, the term "semiconductor" refers to materials which range in resistivity, at room temperature, from $10^{-2}$ to $10^{9}$ ohm-cm., and in which the electrical charge carrier concentration increases with increasing temperature over some temperature range.

It should be appreciated that the diode, field effect transistor, and other structures described herein may be formed by printing in varied sequence. For example, a field effect transistor may be printed with the gate electrode in direct contact with the substrate, followed by a dielectric layer, and finally, with the source, drain, and semiconductor layer applied. Accordingly, the terms "overlies" or "overlying," as used herein, and particularly in the claims, is not intended to be limited to the situation where direct contact between the elements referred to occurs. It is also intended to include situations where the elements are spaced apart, but one lies over, i.e. at least partially above, the other. Thus, a series of elements printed in sequential layers, one on top of the other, are all considered to overlie the substrate though only the first layer applied may be in direct contact with it.

From the foregoing description, it will be seen that a field effect transistor, which may be fully printed, is provided by the present invention. Moreover, it will be seen that such a transistor may be printed along with other circuit components and paths to provide a fully printed circuit, including a field effect transistor.

Having described the invention in connection with certain specific embodiments thereof, it is to be understood that further modifications may now suggest themselves to those skilled in the art and it is intended to cover such modifications as fall within the scope of the appended claims.

What is claimed is:

1. A field effect transistor comprising a printed polycrystalline semiconductor layer, a printed source contact overlying and intimately engaging said semiconductor layer, a printed drain contact overlying and intimately engaging said semiconductor layer and spaced apart from said contact, a printed dielectric overlying said semiconductor layer and portions of said contacts, said dielectric having a dielectric constant no less than on the order of about $10^3$ at the operating frequency of said transistor and comprised of a major proportion of a sodium silicate compound, and a printed gate electrode overlying said dielectric and located between said source and drain contacts.

2. A field effect transistor according to claim 1 in which said compound is a sodium silicate hydrate.

3. A field effect transistor comprising:

an insulating substrate, a printed semiconductor layer overlying said substrate and consisting essentially of a multiplicity of discrete particles of semiconductor material selected from the group consisting of the sulfides, selenides and tellurides of cadmium and zinc, said particles being sintered together, a printed source contact overlying and intimately engaging said layer, a printed drain contact overlying and intimately engaging said layer and spaced apart from said source contact, a printed dielectric comprising a major proportion of a member selected from the group consisting of nitrocellulose and sodium silicate compounds and overlying said semiconductor layer and portions of said source and drain contacts, and a printed gate electrode overlying said dielectric and located between said source and drain contacts.

4. A field effect transistor comprising a printed polycrystalline semiconductor layer, a printed source contact overlying and intimately engaging said semiconductor layer, a printed drain contact overlying and intimately engaging said semiconductor layer and spaced apart from said contact, a printed dielectric overlying said semiconductor layer and portions of said contacts, said dielectric having a dielectric constant no less than on the order of about $10^3$ at the operating frequency of said transistor and comprised of a major proportion of a nitrocellulose compound, and a printed gate electrode overlying said dielectric and located between said source and drain contacts.

References Cited

UNITED STATES PATENTS

| | | | |
|---|---|---|---|
| 1,641,395 | 9/1927 | Moore | 317—234 |
| 2,182,377 | 12/1939 | Guanella | 317—234 X |
| 2,541,832 | 2/1951 | Quinn | 317—237 |
| 3,191,061 | 6/1965 | Weimer | 317—235 X |
| 3,258,663 | 6/1966 | Weimer | 317—235 |

JOHN W. HUCKERT, *Primary Examiner.*

R. F. POLISSACK, *Assistant Examiner.*